United States Patent [19]

Suzuki et al.

[11] Patent Number: 4,494,216
[45] Date of Patent: Jan. 15, 1985

[54] MAGNETIC BUBBLE MEMORY DEVICE

[75] Inventors: Ryo Suzuki; Tadashi Ikeda, both of Kodaira; Masatoshi Takeshita; Naoki Kodama, both of Hachioji, all of Japan

[73] Assignee: Hitachi, Ltd., Tokyo, Japan

[21] Appl. No.: 451,093

[22] Filed: Dec. 20, 1982

[30] Foreign Application Priority Data

Dec. 18, 1981 [JP] Japan ................................ 56-203715

[51] Int. Cl.³ ............................................. G11C 19/08
[52] U.S. Cl. ......................................... 365/36; 365/16
[58] Field of Search .............................. 365/15, 16, 36

[56] References Cited

U.S. PATENT DOCUMENTS 4,086,572  4/1978  Bullock ................................ 365/36
4,360,904 11/1982  Gergis ................................. 365/36

Primary Examiner—James W. Moffitt
Attorney, Agent, or Firm—Antonelli, Terry & Wands

[57] ABSTRACT

Disclosed is a magnetic bubble memory device having a first bubble propagation path formed in an ion-implanted pattern and a second bubble propagation path formed of permalloy elements, both paths being spaced out from each other by a distance larger than or equal to the diameter of the magnetic bubble, and a propagation path connecting structure in which a hairpin-shaped conductor for connecting both propagation paths is disposed between them.

6 Claims, 4 Drawing Figures

MAGNETIC BUBBLE MEMORY DEVICE

BACKGROUND OF THE INVENTION

The present invention relates to a memory device for storing information in the form of bubbles of cylindrical magnetic domain, so-called magnetic bubbles, and more particularly, to a magnetic bubble memory device using a bubble propagation path formed by ion implantation and a bubble propagation path formed of magnetically soft elements in combination.

In order to realize a magnetic bubble memory device of high packaging density, formation of the bubble propagation path by ion implantation is now under examination. In such a device, ions such as He+ are implanted in accordance with a predetermined pattern on the surface of a bubble supporting layer, in which a magnetic buble is held and propagated, so as to form a region in which magnetization is directed in the plane of the bubble supporting layer thereby to form a bubble propagation path. This propagation path (will be hereafter termed "ion-implantation propagation path") is formed in a pattern without a gap, facilitating lithographical processes, and is advantageous for fabricating a device of high packaging density. However, in order for the magnetic bubble memory to be completed, the device needs to have functional portions for generating, replicating and detecting a magnetic bubble and controlling the propagation of the bubble, in addition to storage loops formed by the propagation path. With regard to the ion-implantation propagation path, there have not been achieved a replicater for making a replica of data on a propagation path and a swap gate for controlling data exchange between two propagation paths with satisfactory operational stability.

On the other hand, with regard to the propagation path formed of an alignment of magnetically soft elements such as permalloy (will be hereafter termed "soft-magnetic element propagation path"), there have been realized replicaters and swap gates which operate stably, but it is disadvantageous for fabricating a device of high packaging density due to a certain gap width between patterns beyond which the gap can not be narrowed.

A copending U.S. patent application, Ser. No. 375,344, Sugita et al., filed on May 5, 1982 discloses a compound magnetic bubble memory device which realizes high packaging density and also stable operation. In this compound magnetic bubble memory device, the majority of storage loops (minor loops) are formed of an ion-implantation propagation path, and a read line for reading out data from the minor loops, a write line for writing data onto the minor loops, and a switch or replicater for connecting the read/write lines to the minor loops are formed of magnetically soft elements.

SUMMARY OF THE INVENTION

It is an object of the present invention to provide a connection for propagating a magnetic bubble reliably between an ion-implantation propagation path and a soft-magnetic element propagation path for a compound magnetic bubble memory device.

The present invention resides in a magnetic bubble memory device having a first propagation path formed by selective ion implantation on the surface of a magnetic film and a second propagation path formed of a soft-magnetic film coated on the substrate, wherein the first and second propagation paths are spaced out by at least the diameter of the magnetic bubble and the connection is formed by placing a hairpin-shaped conductor so as to connect both paths.

DESCRIPTION OF THE PREFERRED EMBODIMENTS

Figure 1:
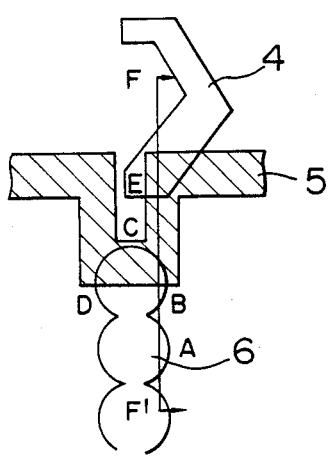
FIG. 1 is a plan view showing one embodiment of the present invention.

FIG. 1 is a plan view showing the connection of propagation paths in a magnetic bubble memory device embodying the present invention. Ions such as Ne+ or He+ are implanted on the surface of a magnetic garnet film so as to form a contiguous disc-shaped non-implantation region, and an ion-implantation propagation path 6 is formed. The ion-implantation propagation path is described in detail in an article entitled "Design of Bubble Device Elements Employing Ion-implanted Propagation Pafferus", by T. J. Nelson, et al., The Bell System Technical Journal, Vol. 59, No. 2, pp. 229-257.

In the neighborhood of the ion-implantation propagation path 6, there is disposed a permalloy propagation path 4 of the asymmetric Chevron type, with a spacing of at least the diameter of the magnetic bubble away from the ion-implantation propagation path 6 so that a magnetic bubble on the ion-implantation propagation path is not prevented from being propagated by the permalloy propagation path. There is further provided a hairpin-shaped conductor 5 connecting the propagation paths 4 and 6.

Figure 2:
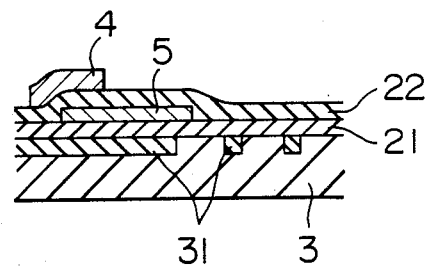
FIG. 2 is a cross-sectional view taken along the line F—F' of FIG. 1.

FIG. 2 is a cross-sectional view of the device taken along the line F—F' of FIG. 1. An ion-implanted layer 31 for forming the ion-implantation propagation path 6 is provided on the surface of a magnetic garnet film 3. On the surface of the layer 31, an insulation film 21 is provided, on which is laid a conductor 5. The conductor 5 is overlaid by an insulator film 22, on which a permalloy propagation path 4 is formed. The hairpin-shaped conductor 5 is preferably formed between the permalloy pattern and the garnet film as mentioned above so as to provide satisfactory propagating characteristics.

Returning to FIG. 1, the operation of the device will be described. A magnetic bubble propagated on the ion-implantation propagation path 6 normally moves on through points or portions A, B, C and D without being affected by the permalloy propagation path 4. However, if a current is supplied to the conductor so as to reduce the bias magnetic field inside the hairpin-shaped conductor, i.e., point or portion C, when the magnetic bubble has come to the position C, the bubble cannot be propagated from C to D, i.e., is blocked, but stretches along the hairpin-shaped conductor. In the case that the portion C of the ion-implantation propagation path 6 is a stable position for the magnetic bubble, end portion E of the permalloy propagation path 4 repulses the magnetic bubble. When the driving magnetic field has turned by 180°, the situation is reversed, and the portion C repulses the magnetic bubble and the end portion E attracts the bubble. In this state, when the current supplied to the conductor is cut off, the magnetic bubble is attracted to the end portion E, causing the bubble to transfer out or move from the ion-implantation propagation path 6 to the permalloy propagation path 4. When the driving magnetic field is rotated oppositely so that the magnetic bubble moves downward on the permalloy propagation path 4 and a current is supplied to the conductor at a proper timing, the magnetic bubble will transfer out or move from the permalloy propagation path 4 to the ion-implantation propagation path 6 as opposed to the above discussion.

In this embodiment, the ion-implantation propagation path 6 has a pitch of 4 μm and the permalloy propagation path 4 has a pitch of 8 μm. The magnetic bubble has a diameter of 1 μm. When the connection of this embodiment was operated in the driving magnetic field of 60 Oe rotating at a frequency of 100 kHz, a marginal bias magnetic field of 8% could be obtained, with the magnitude of current ranging from 30 mA to 80 mA.

An attempt was made to move a magnetic bubble from the permalloy propagation path 4 to the ion-implantation propagation path 6 by reversing the driving magnetic field. As a result, the device could be operated with a marginal bias magnetic field of 8% by shifting the timing of the current supply by 180° relative to the driving magnetic field.

Figure 3:
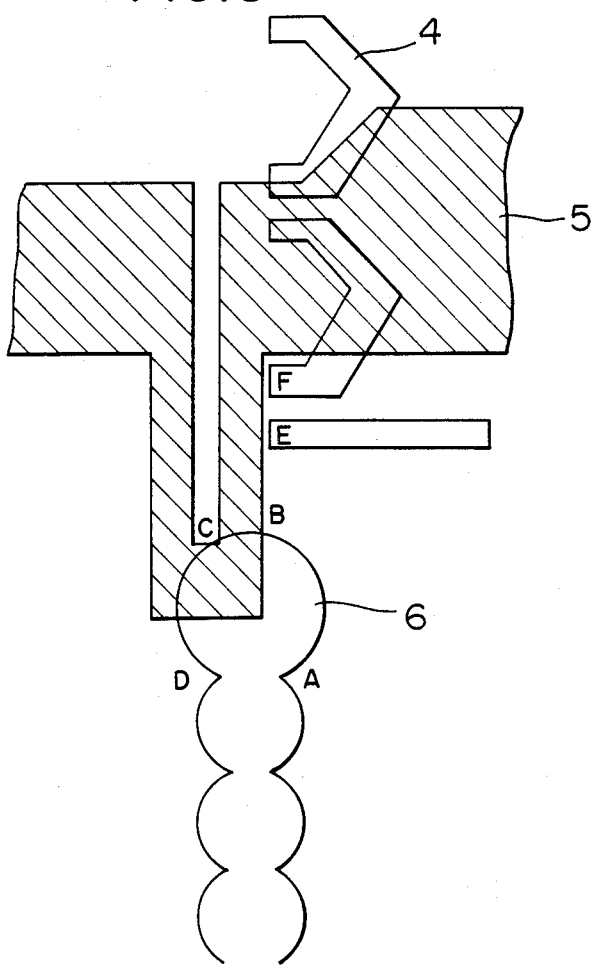
FIGS. 3 and 4 are plan views showing other embodiments of the present invention.

FIG. 3 shows another embodiment of the invention, where the same reference symbols as in FIG. 1 are used for the corresponding portions. This connection operates differently from that of FIG. 1. In this embodiment, a current is supplied to the conductor 5 so as to increase the bias magnetic field at point C inside the hairpin-shaped conductor when the magnetic bubble has come to point B on the ion-implantation propagation path 6 in overlapping relation with an edge of the conductor 5. Then the bubble at point B cannot move to points C and D across the conductor i.e., is blocked. At this time, the portion of point B attracts the magnetic bubble, while end points E and F on the permalloy propagation path 4 repulse the bubble. As the magnetic field rotates, the portion of point B repulses the bubble and the end points E and F come to attract the bubble, causing the bubble to transfer out or move from point B to end point E. After that, even if the supply current is cut off, the magnetic bubble exists on the permalloy propagation path stably and goes on to be propagated on the permalloy propagation path.

By operating the device in the driving magnetic field of 60 Oe at a rotational frequency of 100 kHz for propagating a magnetic bubble having a diameter of 1 μm, a marginal bias magnetic field of 10% could be achieved.

Figure 4:
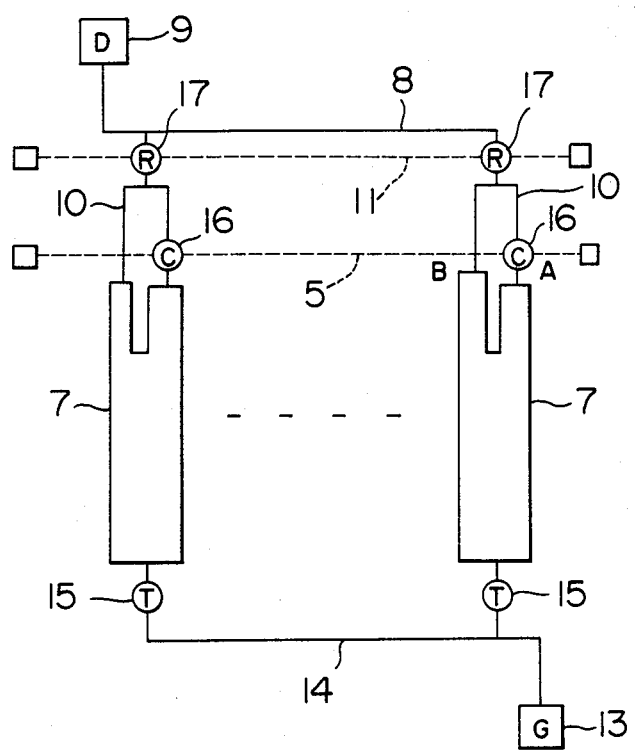

FIG. 4 shows an embodiment of the magnetic bubble memory using the connection described above. A magnetic bubble generator 13 is connected with a write line 14 which is formed of an ion-implantation propagation path. The write line 14 is connected to a plurality of minor loops 7 formed on the ion-implantation propagation path through transfer gates 15. Various types of transfer gate are available, and in this embodiment, a gate for the ion-implantation propagation path as disclosed in IEEE Transactions on Magnetics, Vol. MAG-17, No. 1, pp. 1134-1141 was used. The upper end of each minor loop 7 is connected to a bypass line 10 formed of the permalloy propagation path through a connection 16 corresponding to the connection shown in FIG. 3. The bypass line 10 is connected to a read line 8 through a replicater 17. This replicater may be such as disclosed in IEEE Transaction Magnetics, Vol. MAG-12, No. 6 pp. 614-617. A read line 8 and a detector 9 are formed of permalloy elements.

This device operates characteristically in reading. Normally, a magnetic bubble circulates in the minor loop 7 formed of the ion-implantation propagation path. In the read operation, a current is supplied to the conductor 5 when the bubble has come to point A in FIG. 4 so that the bubble transfers out or moves from the minor loop 7 to the bypass line 10 formed of the permalloy propagation path. Further, a replicating current is supplied to a conductor 11 when the bubble moved to the bypass line 10 has come to the replicater 17. Then, the magnetic bubble to be read out is divided into two, one going through the read line 8 and is detected by the detector 9, and the other going through the bypass line 10 to the connection B for the minor loop 7. This connection simply connects the permalloy propagation path with the ion-implantation propagation path. In this case, the ion-implantation propagation path has a larger drive force than that of the permalloy propagation path, and the magnetic bubble moves naturally from the bypass line 10 to the minor loop 7. Here, the number of bits traveling from point A through the bypass line 10 to point B is made equal to the number of bits traveling on the minor loop to point B, so that the magnetic bubble which has passed point A will return to the same position at point B. This arrangement realizes the block replicating operation which has not been possible by the conventional ion-implanted element.

We claim:

1. A magnetic bubble memory device comprising:
    a bubble supporting layer for holding and propagating bubbles of cylindrical magnetic domain;
    a first bubble propagation path for propagating the magnetic bubbles in accordance with a driving magnetic field rotating in the plane of said bubble supporting layer, said bubble propagation path being formed in a pattern by ion implantation on the surface of said bubble supporting layer;
    a second bubble propagation path for propagating the magnetic bubbles in accordance with said driving magnetic field, said bubble propagation path being formed of a plurality of magnetically soft elements disposed above said bubble supporting layer; and
    bubble transfer means for connecting a point on said first bubble propagation path to an end of said second bubble propagation path and for transferring out a bubble of cylindrical magnetic domain having been propagated to said point through said first bubble propagation path to the end of said second bubble propagation path, said bubble transfer means including a hairpin-shaped conducting layer disposed between said first and second bubble propagation paths and at least in overlapping relation with said point of said first bubble propagation path, said conducting layer being arranged for being supplied with a predetermined amount of electric current for blocking the bubble of cylindrical magnetic domain at said point of said first bubble propagation path until the bubble is repulsed from said point by said driving magnetic field to enable transfer.

2. A magnetic bubble memory device according to claim 1, wherein said first and second bubble propagation paths are spaced out from each other by a distance larger than or equal to the diameter of said magnetic bubble.

3. A magnetic bubble memory device according to claim 1, wherein said conducting layer is formed between said bubble supporting layer and said magnetically soft elements.

4. A magnetic bubble memory device according to claim 1, wherein said hairpin-shaped conducting layer is disposed in overlapping relation with the end of said second bubble propagation path.

5. A magnetic bubble memory device according to claim 1, wherein said conducting layer is supplied with said predetermined amount of electric current so as to block the bubble of cylindrical magnetic domain at a point at which an edge of said hairpin-shaped conducting layer and said first bubble propagation path overlap each other.

6. A magnetic bubble memory device according to claim 1, wherein said bubble transfer means further enables transferring out a bubble of cylindrical magnetic domain from said second bubble propagation path to said first bubble propagation path.

* * * * *

UNITED STATES PATENT AND TRADEMARK OFFICE
CERTIFICATE OF CORRECTION

PATENT NO. : 4,494,216
DATED : January 15, 1985
INVENTOR(S) : Ryo Suzuki, Tadashi Ikeda, Masatoshi Takeshita
Naoki Kodama and Yutaka Sugita It is certified that error appears in the above—identified patent and that said Letters Patent is hereby corrected as shown below:

IN THE TITLE PAGE

Block [75], Line 3, after "Hachioji" insert

--; Yutaka Sugita, of Tokorozawa--

Signed and Sealed this

Fifth Day of November 1985

[SEAL]

*Attest:*

*Attesting Officer*

DONALD J. QUIGG

*Commissioner of Patents and Trademarks*